United States Patent [19]

Fujimura et al.

[11] Patent Number: 4,728,891

[45] Date of Patent: Mar. 1, 1988

[54] NUCLEAR MAGNETIC RESONANCE IMAGING METHOD

[75] Inventors: Satoshi Fujimura; Kiyoshi Yoda, both of Amagasaki, Japan

[73] Assignee: Mitsubishi Denki Kabushiki Kaisha, Tokyo, Japan

[21] Appl. No.: 901,591

[22] Filed: Aug. 29, 1986

[30] Foreign Application Priority Data

Aug. 30, 1985 [JP] Japan ................................ 60-189494

[51] Int. Cl.$^4$ ............................................. G01R 33/20
[52] U.S. Cl. ...................................... 324/309; 324/311
[58] Field of Search ............... 324/300, 307, 311, 309, 324/318, 322

[56] References Cited

U.S. PATENT DOCUMENTS

| | | | |
|---|---|---|---|
| 4,051,429 | 9/1977 | Imanari et al. | 324/311 |
| 4,558,277 | 12/1985 | Post et al. | 324/309 |
| 4,577,152 | 3/1986 | Macovski | 324/309 |
| 4,588,948 | 5/1986 | Mansfield | 324/309 |

*Primary Examiner*—Michael J. Tokar
*Attorney, Agent, or Firm*—Oblon, Fisher, Spivak, McClelland & Maier

[57] ABSTRACT

A nuclear magnetic resonance imaging method having the first step of exciting a nuclear spin in a volume of an object in a static magnetic field, the second step of applying first, second and third gradients, and the third step of producing a spin echo signal under the second gradient in accordance with the nuclear spin which has the step of applying a high frequency pulse in which the nuclear spin is approximately tilted at 116° as an exciting pulse in the first step.

8 Claims, 4 Drawing Figures

NUCLEAR MAGNETIC RESONANCE IMAGING METHOD

BACKGROUND OF THE INVENTION

1. Field of the Invention

This invention relates to a nuclear magnetic resonance imaging method and, more particularly, to a novel method of applying a high frequency pulse to tip a nuclear spin at a predetermined angle.

2. Discussion of Background

FIG. 4 shows a waveform diagram of parts of signals in a nuclear magnetic resonance imaging method described, for example, on pages 139 to 145 of "Proceedings of the symposium on Nuclear Magnetic Resonance Imaging" magazine issued in 1982. In FIG. 4, symbol Gx designates a first gradient, symbol Gy designates a second gradient, symbol Gz designates a third gradient, symbol SIGNAL designates an NMR (Nuclear Magnetic Resonance, hereinafter referred to as "an NMR signal") signal, and symbol RF designates a high frequency pulse.

In a prior-art nuclear magnetic resonance imaging method, a 90° pulse (RF1) of a high frequency pulse (RF) of a selective excitation pulse is applied to a magnetic field generator, not shown, together with a gradient Gz1 in a third gradient Gz. At this time, the pulses are not applied to the first and second gradients Gx and Gy. Thus, a nuclear spin (not shown) in a thin slab (not shown) having a predetermined thickness in an object (not shown) is selectively excited. Then, gradients Gx2 and Gy2 in the first and second gradients Gx and Gy parallel to the thin slab are applied to the object, and the third gradient Gz is further inverted from the gradients Gz1 to Gz2. Thereafter, after $\tau_2$ time from the application of the 90° pulse (RF1), a 180° pulse (RF3) of the high frequency pulse (RF) is applied, and the gradient Gx4 of the first gradient Gx is then applied. A spin echo signal is observed in the presence of the gradient Gx4 by the abovementioned operation. Therefore, when the NMR signal is sampled Nx times, if the outputs are Fourier-transformed, the spin density is projected on an x axis. In other words, the second gradient Gy alters the phases of the spins in y direction. A series of the operation is repeated for the second gradient Gy of Ny pieces of the values, and when the outputs obtained from this result are Fourier-transformed, the density value of Nx x Ny array is formed. It is understood that this method can form a two-dimensional image of a predetermined plane in the object.

Since the 90° pulse of the high frequency pulse is used as an exciting pulse in the prior-art nuclear magnetic resonance imaging method, the method has such disadvantages that the influence of the irregularity of the high frequency magnetic field to the NMR signal cannot be ignored and the irregular intensity produced in an image cannot be minimized.

SUMMARY OF THE INVENTION

This invention has been made in order to eliminate the disadvantages of the prior art as mentioned above, and has for its object to provide a nuclear magnetic resonance imaging method capable of minimizing the influence of the irregularity of the high frequency magnetic field to an NMR signal and minimizing the irregular intensity on an image.

More specifically, the nuclear magnetic resonance imaging method according to this invention employs a high frequency pulse in which a nuclear spin is approximately tipped at 116° as an exciting pulse to be applied to a gradient to generate NMR signal. Thus, since the NMR signal is generated by the high frequency pulse in which the nuclear spin is approximately tilted at 116° as an exciting pulse in this invention, the influence of the irregularity in the high frequency magnetic field to the NMR signal can be minimized, and a stable image having less irregular intensity can be produced.

DESCRIPTION OF THE PREFERRED EMBODIMENTS

Figure 1:
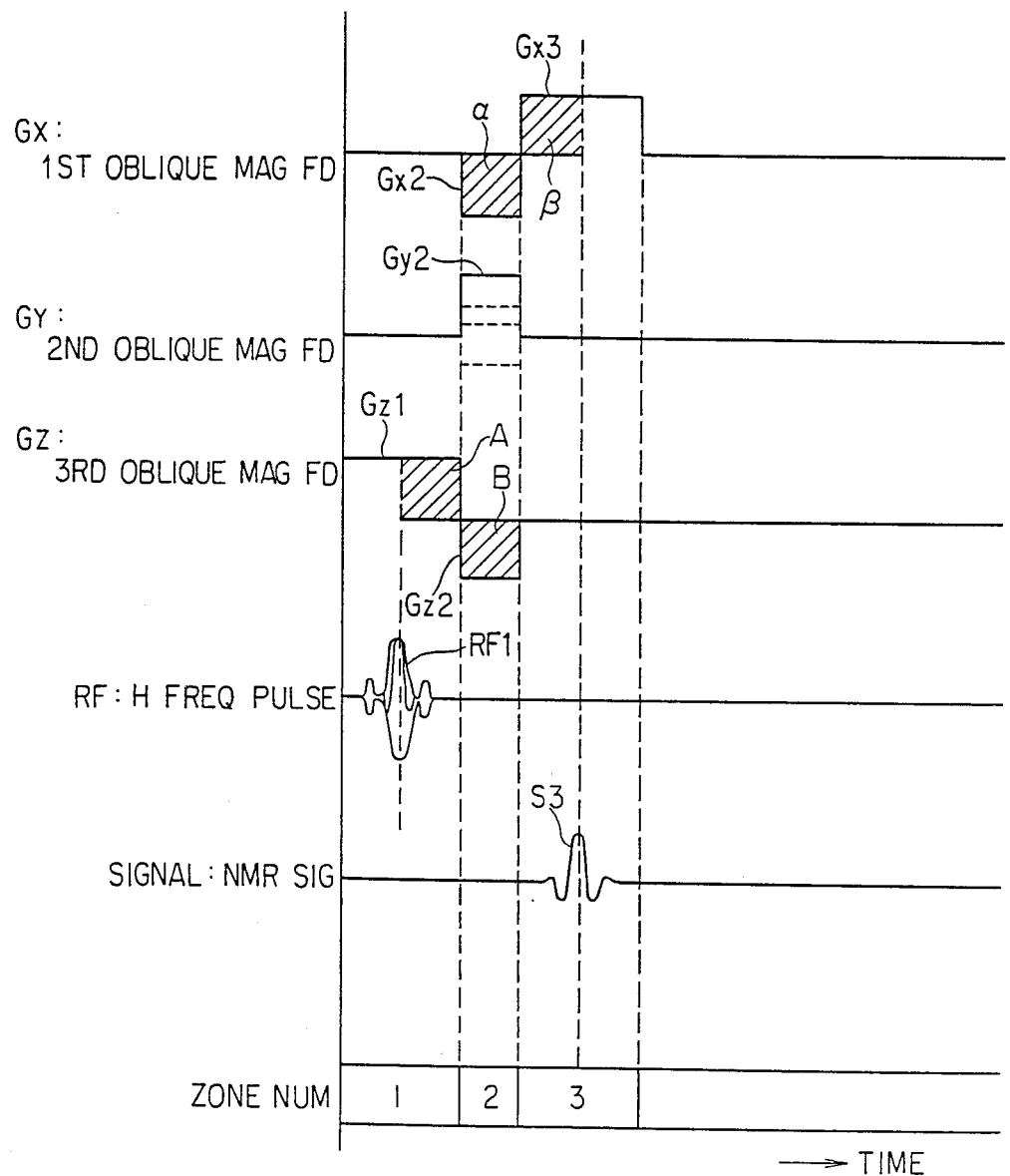
FIG. 1 is a waveform diagram showing a pulse sequence in a nuclear magnetic resonance imaging method according to an embodiment of this invention.

An embodiment of this invention will be described with reference to the drawings. In FIG. 1, symbol Gx designates a first gradient, symbol Gy designates a second gradient, symbol Gz designates a third gradient, symbol SIGNAL designates an NMR signal, and symbol RF designates a high frequency pulse. An apparatus for executing the method of this invention may use a nuclear magnetic resonance imaging apparatus similar to the prior art type in which a static magnetic field H₀ is applied along a z axis, and a high frequency is transmitted along x or y axis. A receiving method employs "a QD (Quadrature Detection)" method.

Further, since an apparatus for forming first, second and third gradient Gx, Gy, Gz in x-, y- and z-axis directions, respectively in a static magnetic field H₀ is described, for example, on pages 947 to 955 of "Journal of Physics E: Scientific Instrument" magazine, Vol. 13, and the detailed description will be omitted.

Figure 2:
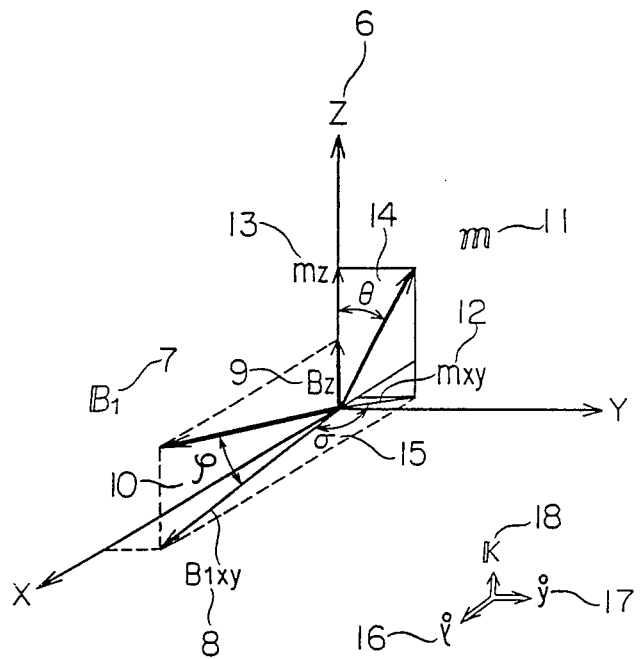
FIG. 2 is a vector diagram showing the relationship between a nuclear spin and a high frequency magnetic field.

In FIG. 2, numeral 6 designates the direction of a static magnetic field H₀. Numeral 7 designates a high frequency magnetic field generated when a current of 1(A) (o-peak) is flowed to a high frequency coil (not shown), numeral 8 designates the component of the high frequency magnetic field 7 in a x-y axis plane, numeral 9 designates the z-axis direction component of the high frequency magnetic field 7, and numeral 10 designates an angle $\phi$ formed between the x-y axis plane of the high frequency magnetic field 7 and the x axis. Numeral 11 designates a nuclear spin, numeral 12 designates the component of the nuclear spin 11 in the x-y axis plane, numeral 13 designates the z-axis direction component of the nuclear spin 11, numeral 14 designates an angle $\theta$ of the nuclear spin 11 formed to the z axis. Numeral 15 designates an angle $\theta$ of the nuclear spin 11 formed between the component in the x-y axis plane and the x axis. Numerals 16 to 18 designate unit vectors of x-, y-, z-axis directions.

The operation will be described. In the first zone of FIG. 1, the pulse RF1 of the high frequency pulse RF for approximately tilting the nuclear spin 11 at 116° is applied together with the gradient Gz1 of the third gradient Gz. At this time, the first and second gradients Gz, Gy are not applied. Thus, the nuclear spin 11 in the thin slab having a predetermined thickness is selectively excited. At this time, the thickness of the thin slab can be arbitrarily designated by varying the band width of the pulse RF1 of the high frequency pulse RF or the amplitude of the gradient Gz1 of the third gradient Gz.

Furthermore, in order to observe a spin echo signal S3 phase-modulated by an NMR signal (SIGNAL) in the presence of the gradient Gx3 of the first gradient Gx in the third zone in FIG. 1, the gradients Gx2, Gz2 in the first and third gradients Gx, Gz and a phase modulation oblique magnetic field Gy2 of the second gradient Gy are applied in the second zone. Here, the magnitude of the phase modulation gradient Gy2 is set to $\gamma Ly \int Gy dt \leq 2\pi$, where symbol Ly designates the length of an object to be measured in y-axis direction. It is matters of common knowledge to correct the disorder of the spin by the third gradient Gz by A=B, where the time integrated values A and B of the third gradient Gz designated by a hatched portion in FIG. 1. For example, it is disclosed in detail in "Nuclear magnetic resonance: beyond physical imaging" written by Paul A. Bottomley, described on pages 32 to 38 of "IEEE Spectrum" issued in February, 1983.

More particularly, in the third zone of FIG. 1, a spin echo signal S3 is observed in the presence of the gradient Gx3 of the first gradient Gx. During the observation of the spin echo signal S3 the gradient Gx3 is constant. The maximum value of the absorption component of the spin echo signal S3 is observed at a time when the integrated time values $\alpha$, $\beta$ (a hatched portions in FIG. 1) of the first gradient Gz become $\alpha = \beta$. In other words, the following equation is provided.

$$-\int Gx(2)dt = \int^{tp(3)} Gx(3)dt \quad (1)$$

where tp(3) in the equation (1) is the time when the spin echo signal S3 takes the maximum value in the third zone.

transmission and a reception are carried out by the same high frequency coil). The principle of the equation (2) will be described with reference to FIG. 2, and the principle of the equation (2) is disclosed, for example, in "The Signal-to-Noise Ratio of the Nuclear Magnetic Resonance Experiment" written by D. I. Hoult et al) described on pages 71 to 85 of Vol. 24 of "Journal of Magnetic Resonance" issued in 1976, as below.

$$a\xi(x,y,z) = -\frac{\partial}{\partial t}(\vec{B}_1 \cdot \vec{M}(z,y,z))$$

where $\vec{B}_1$ designates a high frequency magnetic field generated at a point (x, y, z) when a current of 1(A) (o-peak) is flowed to the high frequency coil, and $\vec{M}$ designates a nuclear spin 11 presented at the point (x, y, z). In the equation (2), a proportional constant is ignored.

For example, assume that the nuclear spin 11 is tilted at $\theta°$ by the high frequency magnetic field. At this time, the following calculation can be performed.

$$\vec{B}_1 = B_{/xy}\text{COS} + B_{/xy}\sin + \vec{k} B_{/z} \quad (3)$$

$$\vec{M} = m_{xy}(\hat{x}\sin(\omega_o t + a) + \hat{y}\cos(\omega_o t + \sigma)) + m_z \quad (4)$$

$$m_{xy} = m\sin\theta \quad (5)$$

$$m_z = m\cos\theta \quad (6)$$

$$\theta = \gamma \int_{-\infty}^{\infty} \frac{B_{/xy}}{2} \frac{I(t)}{(o\text{-peak})} dt \quad (7)$$

$$\partial = \phi + \frac{\pi}{2} \quad (8)$$

where m designates the magnitude of the nuclear spin 11, $\omega_0$ designates a resonance angle frequency, $\gamma$ designates a gynomagnetic ratio, and I(t) designates a current flowed to the high frequency coil (not shown).

Therefore, when the equations (3) and (4) are substituted for the equation (2), the received signal voltage (d$\xi$) becomes as below:

$$a\xi(x,y,z) = -\frac{\partial}{\partial t}[\hat{x} B_{/xy}\cos\phi + \hat{y}B_{/xy}\sin\phi + \vec{k} B_z\}\{\hat{x} m_{xy}\cos(\omega_o t + \sigma) + \hat{y}m_{xy}\sin(\omega_o t + \sigma) + \vec{k} m_z\}] \quad (9)$$

$$= -\frac{\partial}{\partial t}(B_{/xy}\cos\phi \cdot m_{xy}\cos(\omega_o t + \sigma) + B_{/xy}\sin\phi \cdot m_{xy}\sin(\omega_o t + \sigma) + B_z m_z)$$

$$= -\frac{\partial}{\partial t}\{B_{/xy}m_{xy}\cos(\omega_o t + \sigma - \phi) + B_z m_z\}$$

$$= -\frac{\partial}{\partial t}\{B_{/xy}m\sin\theta\cos(\omega_o t + \sigma - \phi)\} \quad (\because B_z = \text{const})$$

$$= -\frac{\partial}{\partial t}(-B_{/xy}m\sin\theta\sin\omega_o t)$$

$$= \omega_o B_{/xy(x,y,z)}m\sin\left\{\frac{\tau}{2}\int_{-\infty}^{\infty}\frac{I(t)}{(o\text{-peak})}B_{/xy(x,y,z)}\partial t\right\}\cos\omega_o t$$

After the abovementioned third zone is finished, the operations from the abovementioned first to third zones will be repeated N times.

In the operation sequence described above, the received signal voltage ($a\xi$) induced in a high frequency coil (not shown) by the nuclear spin 11 presented at a point (x, y, z) is indicated by the following equation (2) in case, for example, of a single coil type (in which a In this case, when the high frequency pulse RF is a pulse RF1 and a SINC function is used, since the current flowed to the high frequency coil (not shown) is represented by:

$$I(t) = I_{o-peak}\frac{\sin \Omega t}{\pi t} \quad (10)$$

the following equation is obtained:

$$\int_{-\infty}^{\infty} I(t)\partial_t = I_{(o-peak)} \quad (11)$$

Therefore, the following equation is obtained:

$$\theta = \frac{\gamma I_{(o-peak)}}{2} B_{/xy(x,y,z)} \quad (12)$$

$$\therefore \alpha\xi_{(x,y,z)} \propto mB_{/xy(x,y,z)}\sin\left\{\frac{\gamma I_{(o-peak)}}{2} B_{/xy(x,y,z)}\right\}\cos\omega_o t \quad (13)$$

$$\therefore \alpha\xi_{(x,y,z)} \propto B_{/xy(x,y,z)}\sin\{\alpha B_{/xy(x,y,z)}\} \quad (14)$$
(o-peak)
where $\alpha = \gamma/2I_{(o-peak)}$ The equation (14) represents the relationship between the high frequency magnetic field $B_{1xy(x,y,z)}$ and the received signal voltage $\alpha\xi(x,y,z)$.

As apparent from the equations (12) and (13), even if the space distribution of the nuclear spin (x, y, z) is uniform, if there exists a nonuniformity in the space distribution of the high frequency magnetic field $B_{1xy(x,y,z)}$, an irregularity occurs in the space distribution of the received signal voltage $\alpha\xi(x,y,z)$ to be originally uniform. This is expressed as an irregular intensity on an NMR image.

Then, the pulse conditions for minimizing the variation in the received signal voltage $\alpha\xi(x,y,z)$ by the equation (14) will be considered in the case that the nonuniformity in the space is presented in the high frequency magnetic field $B_{1xy}$. Since a variable in the pulse RF1 of the given high frequency pulse RF is the high frequency magnetic field $B_{1xy(x,y,z)}$, the following equation can be obtained:

$$\frac{\alpha\xi}{\alpha B_{/xy}} = A\{\sin(\alpha B_{/xy}) + \alpha B_{/xy}\cos(\alpha B_{/xy})\} = O \quad (15)$$

From the above equation (15), the conditions of the frequency pulse for minimizing the variation in the received signal voltage ($\alpha\xi$) can be obtained, where the proportional constant in the equation (14) is designated by A.

Further, from the equation (15), the following calculation is obtained.

$$\alpha B_{/xy}\cos(\alpha B_{/xy}) = -\sin(\alpha B_{/xy}) \quad (16)$$

$$\alpha B_{/xy} = -\tan(\alpha B_{/xy}) \quad (17)$$

and the following result can be obtained.

$$\therefore \alpha B_{/xy} \approx 2.088 \quad (18)$$

$$\approx 1.291 \times \frac{\pi}{2}$$

$$\approx 116.2°$$

More particularly, when the high frequency pulse for tipping the nuclear spin near at 116° is used, the variation depending upon the irregular space of the high frequency magnetic field $B_{1xy}$ of the received signal voltage ($\alpha\xi$) is minimized, and the irregular indensity on the image can be suppressed to the minimum.

Figure 3:
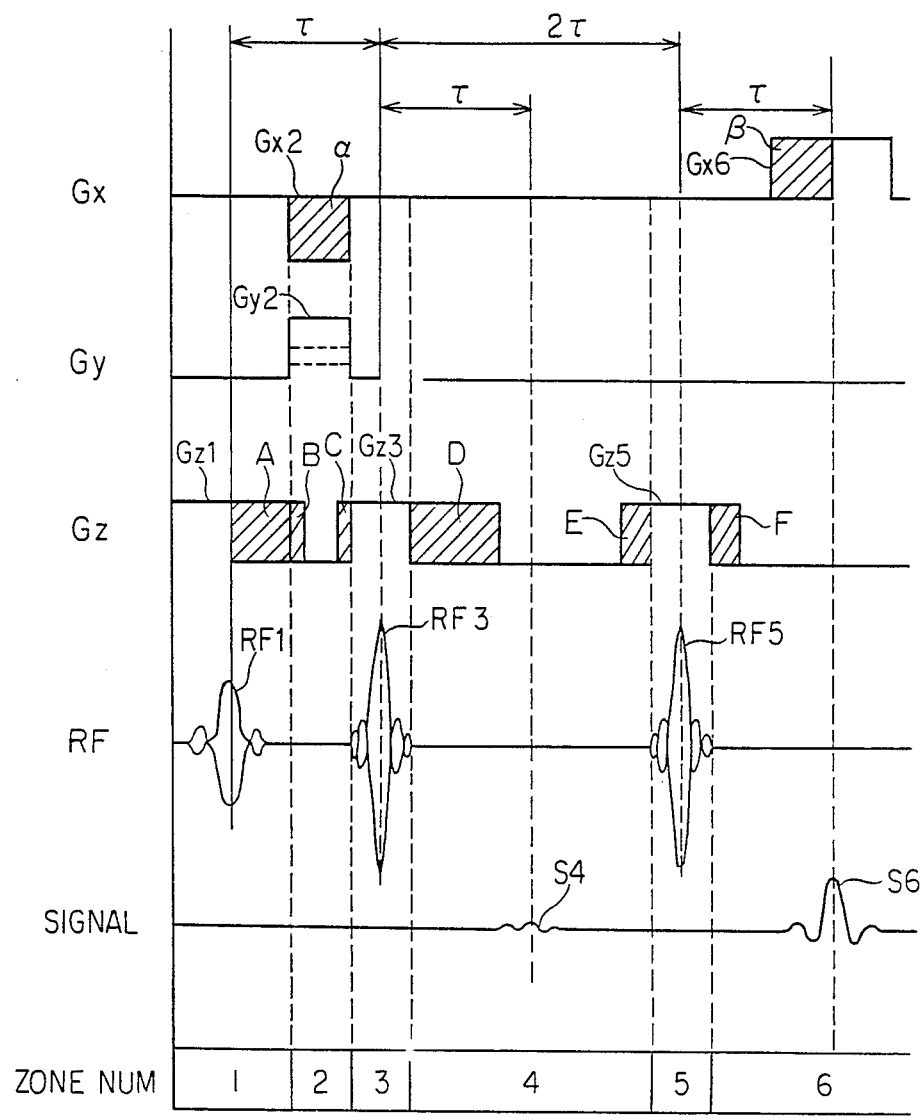
FIG. 3 is a waveform diagram showing a pulse sequence in a nuclear magnetic resonance imaging method according to another embodiment of this invention.
Figure 4:
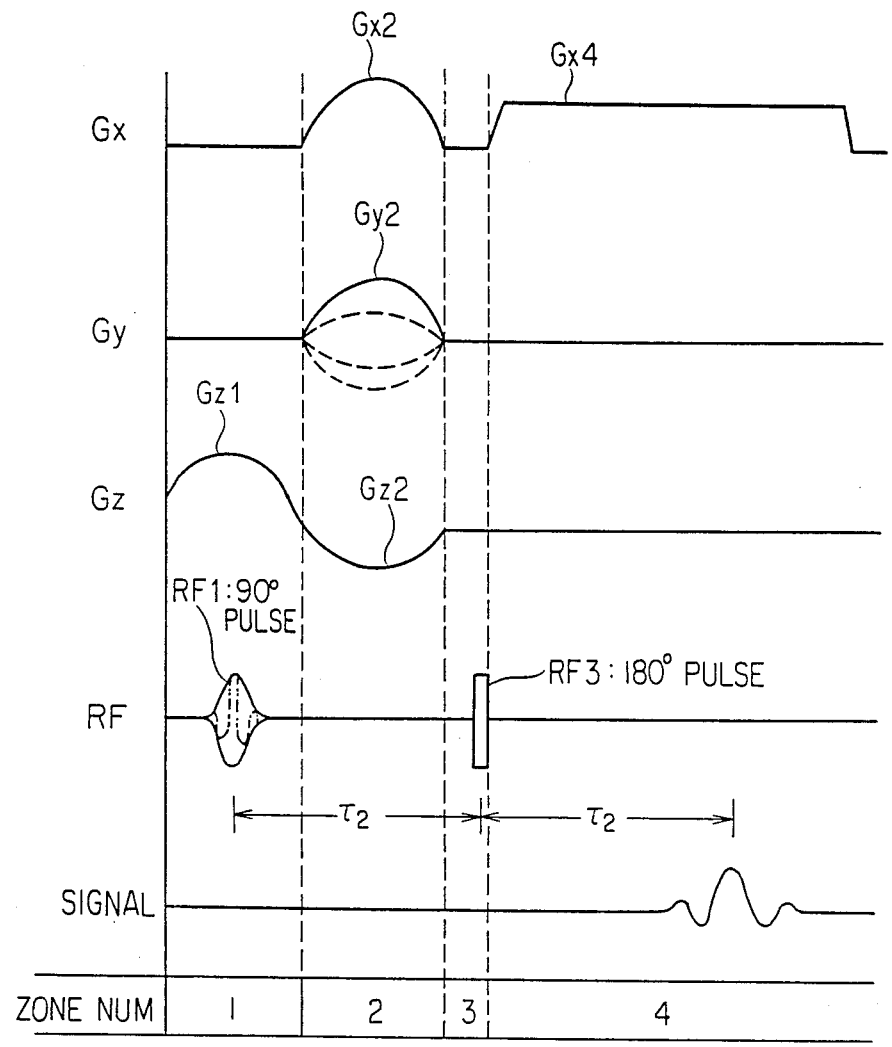
FIG. 4 is a waveform diagram showing a pulse sequence in a prior-art nuclear magnetic resonance imaging method

Then, second embodiment of this invention will be described with respect to FIG. 3. In FIG. 3, symbol Gx designates a first gradient, symbol Gy designates a second gradient, symbol Gz designates a third gradient, symbol SIGNAL designates an NMR signal, and symbol RF designates a high frequency pulse. An apparatus for executing the second embodiment of this invention may use the apparatus which is entirely the same as that of the first embodiment.

The applying operations of gradient Gx, Gy and Gz, an NMR signal (SIGNAL) and a high frequency pulse RF in the first zone in FIG. 3 are entirely the same as those of the abovementioned first embodiment, and the description will be omitted.

Furthermore, in order to observe a spin echo signal S6 phase-modulated in the presence of the gradient Gx6 of the first gradient Gx in the sixth zone in FIG. 3, the gradients Gx2 of the first gradient Gx and the phase modulation gradient Gy2 of the second oblique magnetic field Gy are applied. The following operations are equal to those of the abovementioned first embodiment, and the description will be omitted.

In the sixth zone of FIG. 3, in order to observe a spin echo signal S6 phase-modulated in the presence of the oblique magnetic field Gx6 of the first gradient Gx, a 180° pulse RF3 of the high frequency pulse RF is applied together with the gradient Gz3 of the third gradient Gz after τ time from the pulse RF1 of the high frequency pulse RF in the third zone.

At this time, it is as matters of common knowledge to correct the disorder of the spin by the third gradient Gz where the time integrated values A, B, C, D (hatched portions in FIG. 3) of the third gradient Gz are set to the relationship of A+B+C=D. (For example, it is disclosed in "Proton NMR tomography" written by P. R. Locher on pages 73 to 88 of Vol. 43 of "Philips Technical Rev.".

In the fourth zone of FIG. 3, a spin echo signal S4 of the NMR signal (SIGNAL) is observed after τ time from the 180° pulse RF3 (second, i.e., the even number) of the high frequency pulse RF. However, since the image is not reformed by the first gradient Gx, the magnitude is very small.

In the sixth zone of FIG. 3, in order to observe a spin echo signal S6 position-modulated in the presence of the gradient Gx6 of the first oblique magnetic field Gx, a 180° pulse RF5 of the high frequency pulse RF is applied together with the gradient Gz5 of the third oblique magnetic field Gz in the fifth zone after 2τ from the 180° pulse RF3. In this case, the area E,F of the shown hatched portion is E-F.

In the sixth zone of FIG. 3, the spin echo signal S6 can be observed in the presence of the gradient Gx6 of the first gradient Gx. The maximum value of the absorption component of the spin echo signal S6 is observed after τ time from the 180° pulse RF5. The other operations are the same as those in the first embodiment, and the description will be omitted.

The operations after the abovementioned six zone are again returned to the first zone, and will be repeated N times from the first to the sixth zones.

The phases of the 180° pulses RF3, RF5 employ a method of avoiding the attenuation of the signal due to the incompleteness of the 180° pulse by varying 90° from the phase of the pulse RF1 known per se such as, for example, a method disclosed in "Rev. Sci. Instr." Written by S. Meiboom et al on page 688 of Vol. 29 issued in 1958.

In the operation sequence described above, the equivalent conclusion can be provided by the operation in the first embodiment and the similar calculation for the received signal voltage ($\alpha\xi$) induced in a high frequency coil by the nuclear spin 11 presented at a point (x, y, z).

In the second embodiment described above, the case that the 180° pulse uses the SINC function has been described. However, when the 180° pulses are all formed of rectangular waves, the gradient applied simultaneously with the abovementioned 180° pulses may not be used. Further, the phases of the high frequency pulse RF1 and the 180° high frequency pulse may be in phase. The first gradient Gx applied to observe the NMR signal in the presence of the gradient Gx6 in the sixth zone may be applied in the sixth zone instead of applying the first gradient Gx in the second zone to obtain the similar operation if $\alpha=\beta$ described above is satisfied. On the contrary, the symbols are inverted and may be applied in the fourth zone.

Further, the symbols are inverted in the second zone, and may be applied in the second zone. At this time, a spin echo signal S4 is observed in the fourth zone. The amplitude of the oblique magnetic field may be as below if satisfying the following equations.

$$\int tp(4)Gx(4)dt = \int^{tp(6)} Gx(6)dt$$

$$\int Gx(1)dt = \int^{tp(4)} Gx(4)dt$$

where tp(n) designates a time when the spin echo signal Sn takes the maximum value in n-th zone.

Further, in the first and second embodiments described above, SINC functions are used as the high frequency pulses. However, gauss function, rectangular waves and the composite wave or combination may be employed.

Further, in the embodiments described above, the waveforms of the gradients have been described by rectangular waves. However, trapezoidal or triangular waves may be employed. Moreover, the phase modulation second gradients Gy may be any if equal to $\int Gy(2)dt$. The first gradient Gx may employ any shape of the gradient Gx2 if satisfying $\alpha=\beta$ described as above, and the others may be any waveform having a constant value in the received signal. Further, the shape of the third gradient Gz may be any if constant during the application of the high frequency pulse and the rise and fall of the high frequency pulse satisfy the conditions described above.

A method of applying the second gradient Gy for the phase modulation has executed once in the first and second embodiments described above. However, the method may be divided into plural times. At this time, the sum of the time integration of the gradient applied by dividing into the plurality may be equalized to $\int(-Gy(2)dt$ described as above.

Further, when information relative to the relaxation time is desirably obtained, the step of inverting the nuclear spin may be added prior to the first steps of the first and second embodiments described above.

In addition, a method of inverting the nuclear spin may not be limited to 180° pulse, but may used a high speed adiabatic passing method.

According to this invention as described above, the NMR signal is generated by using the high frequency pulse tilted approximate at 116° at the nuclear spin as the exciting pulse. Therefore, the influence of the irregular high frequency magnetic field to the NMR signal can be minimized, and the image having small irregular indensity can be produced. Even if the high frequency coil is reduced to improve the S/N ratio, the uniformity of the receiving sensitivity of the same space area can be equalized.

What is claimed is:

1. A nuclear magnetic resonance imaging method having the first step of exciting a nuclear spin in a volume of an object in a static magnetic field, the second step of applying first, second and third gradients, and the third step of producing a spin echo signal under the second gradient in accordance with said nuclear spin comprising:
   the step of applying a high frequency pulse in which said nuclear spin is approximately tipped at 116° as an exciting pulse in said first step.

2. The nuclear magnetic resonance imaging method according to claim 1, wherein said first step excites the nuclear spin by a high frequency pulse in the presence of the first gradient having an direction perpendicular to an arbitrary thin slab.

3. The nuclear magnetic resonance imaging method according to any of claim 1, wherein said third step produces a spin echo signal by inverting the second gradient.

4. The nuclear magnetic resonance imaging method according to any of claim 1, wherein said third step produces a spin echo signal by using a 180° pulse as a high frequency pulse.

5. The nuclear magnetic resonance imaging method according to any of claim 1, wherein said third step applies two or more 180° pulses, and using a spin echo signal reformed by even number of 180° pulses when producing a signal with the 180° pulses as high frequency pulses.

6. The nuclear magnetic resonance imaging method according to any of claim 1, wherein said third step varies at 90° the phase of the high frequency pulse for tipping the 180° pulses and the nuclear spin near at 116°.

7. The nuclear magnetic resonance imaging method according to claim 1, further comprising the step of executing the step of inverting the nuclear spin prior to the first step.

8. The nuclear magnetic resonance imaging method according to claim 1, wherein as a method of inverting the nuclear spin, 180° high frequency pulse or high speed adiabatic passing method is used.

* * * * *